(12) United States Patent
Lee et al.

(10) Patent No.: US 11,350,529 B2
(45) Date of Patent: May 31, 2022

(54) SUBSTRATE STRUCTURE AND ELECTRONIC DEVICE INCLUDING THE SAME

(71) Applicant: SAMSUNG ELECTRO-MECHANICS CO., LTD., Suwon-si (KR)

(72) Inventors: Seung Eun Lee, Suwon-si (KR); Yong Hoon Kim, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 22 days.

(21) Appl. No.: 16/876,348

(22) Filed: May 18, 2020

(65) Prior Publication Data
US 2021/0298177 A1   Sep. 23, 2021

(30) Foreign Application Priority Data
Mar. 17, 2020  (KR) .................. 10-2020-0032637

(51) Int. Cl.
| | |
|---|---|
| H05K 1/18 | (2006.01) |
| H05K 1/14 | (2006.01) |
| H05K 1/11 | (2006.01) |
| H01L 25/16 | (2006.01) |
| H05K 1/09 | (2006.01) |
| H01L 23/498 | (2006.01) |
| H01L 23/00 | (2006.01) |

(52) U.S. Cl.
CPC ....... *H05K 1/185* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 25/16* (2013.01); *H05K 1/09* (2013.01); *H05K 1/111* (2013.01); *H05K 1/144* (2013.01); *H01L 2224/16227* (2013.01); *H05K 2201/041* (2013.01); *H05K 2201/10015* (2013.01); *H05K 2201/10734* (2013.01)

(58) Field of Classification Search
CPC ................. H01L 24/16; H01L 23/4983; H01L 23/49833; H01L 23/49822; H01L 23/49816; H05K 1/185
USPC ....................................................... 361/763
See application file for complete search history.

(56) References Cited

U.S. PATENT DOCUMENTS

| | | |
|---|---|---|
| 9,337,138 B1 | 5/2016 | Abugharbieh et al. |
| 2021/0289629 A1 | 9/2021 | Lee et al. |

FOREIGN PATENT DOCUMENTS

| | | |
|---|---|---|
| EP | 1139705 A1 | 10/2001 |
| KR | 10-1384035 B1 | 4/2014 |
| KR | 10-2021-0114733 A | 9/2021 |

*Primary Examiner* — Tremesha S Willis
(74) *Attorney, Agent, or Firm* — Morgan, Lewis & Bockius LLP

(57) ABSTRACT

A substrate structure and electronic device provide improved power integrity and simplified manufacturing. The substrate structure includes a first printed circuit board, having a first side and a second side opposing each other, and a plurality of passive components embedded in the first printed circuit board. The plurality of passive components includes a first group, including a plurality of first passive components disposed adjacent to each other, and a second group, including a plurality of second passive components disposed adjacent to each other. A smallest distance between the first and second groups is greater than at least one of a smallest distance between adjacent first passive components and a smallest distance between adjacent second passive components.

7 Claims, 18 Drawing Sheets

SUBSTRATE STRUCTURE AND ELECTRONIC DEVICE INCLUDING THE SAME

CROSS-REFERENCE TO RELATED APPLICATION(S)

This application claims the benefit under 35 USC 119(a) of Korean Patent Application No. 10-2020-0032637 filed on Mar. 17, 2020 in the Korean Intellectual Property Office, the entire disclosure of which is incorporated herein by reference for all purposes.

BACKGROUND

1. Field

The present disclosure relates to a substrate structure and an electronic device including the same.

2. Description of Related Art

As the number and integration density of input/output (I/O) units have been significantly increased with the trend for high-performance electronic products, there has been demand for technologies for a high-multilayer and large-scale substrate. For example, there is a need to increase a size of a flip chip ball grid array (FCBGA) substrate for a high-performance semiconductor and the number of layers. Such a demand causes issues such as an increase in technical difficulty and a decrease in yield, which results in an increase in costs. Accordingly, there is demand for technologies capable of reducing manufacturing costs while maintaining semiconductor performance. In addition, power integrity has emerged as an important characteristic with the trends for high performance of electronic products.

SUMMARY

An aspect of the present disclosure is to provide a substrate structure, capable of improving power integrity, and an electronic device including the same.

An aspect of the present disclosure is to provide a substrate structure, capable of satisfying demand for a high-multilayer and large-scale substrate, and an electronic device including the same.

An aspect of the present disclosure is to provide a substrate structure, capable of reducing costs, and an electronic device including the same.

According to an aspect of the present disclosure, a plurality of passive components, able to be grouped, are embedded in a substrate.

According to an aspect of the present disclosure, a printed circuit board is disposed on another printed circuit board to provide a substrate structure.

For example, a substrate structure includes a first printed circuit board, having a first side and a second side opposing each other, and a plurality of passive components embedded in the first printed circuit board. The plurality of passive components includes a first group, including a plurality of first passive components disposed adjacent to each other, and a second group, including a plurality of second passive components disposed adjacent to each other. A smallest distance between the first and second groups is greater than at least one of a smallest distance between adjacent first passive components of the plurality of first passive components or a smallest distance between adjacent second passive components of the plurality of second passive components.

For example, an electronic device includes a mainboard, a first printed circuit board disposed on the mainboard, a plurality of passive components embedded in the first printed circuit board, and a semiconductor chip disposed on the first printed circuit board. The plurality of passive components includes a first group, including a plurality of first passive components, and a second group, including a plurality of second passive components. The semiconductor chip includes a first functional circuit and a second functional circuit. At least a portion of the first group and at least a portion of the second group overlap the first functional circuit and the second functional circuit, respectively, when viewed from above.

In a further example, a printed circuit board has opposing first and second surfaces, and is configured for having a semiconductor chip, having first and second functional circuits disposed adjacent to each other on a plane, mounted on the second surface. The printed circuit board includes a planar insulating layer and passivation layers disposed between the planar insulating layer and each of the first and second surfaces, and each passivation layer has openings exposing pads through a corresponding one of the first or second surface. The planar insulating layer includes a cavity having a plurality of passive components disposed therein and connected to the pads exposed through the second surface, and a first passive component of the plurality of passive components is disposed in an area overlapped by the first functional circuit of the semiconductor chip, and a second passive component of the plurality of passive components is spaced apart from the first passive component and is disposed in an area overlapped by the second functional circuit of the semiconductor chip.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure will be described as follows with reference to the attached drawings.

Figure 1:
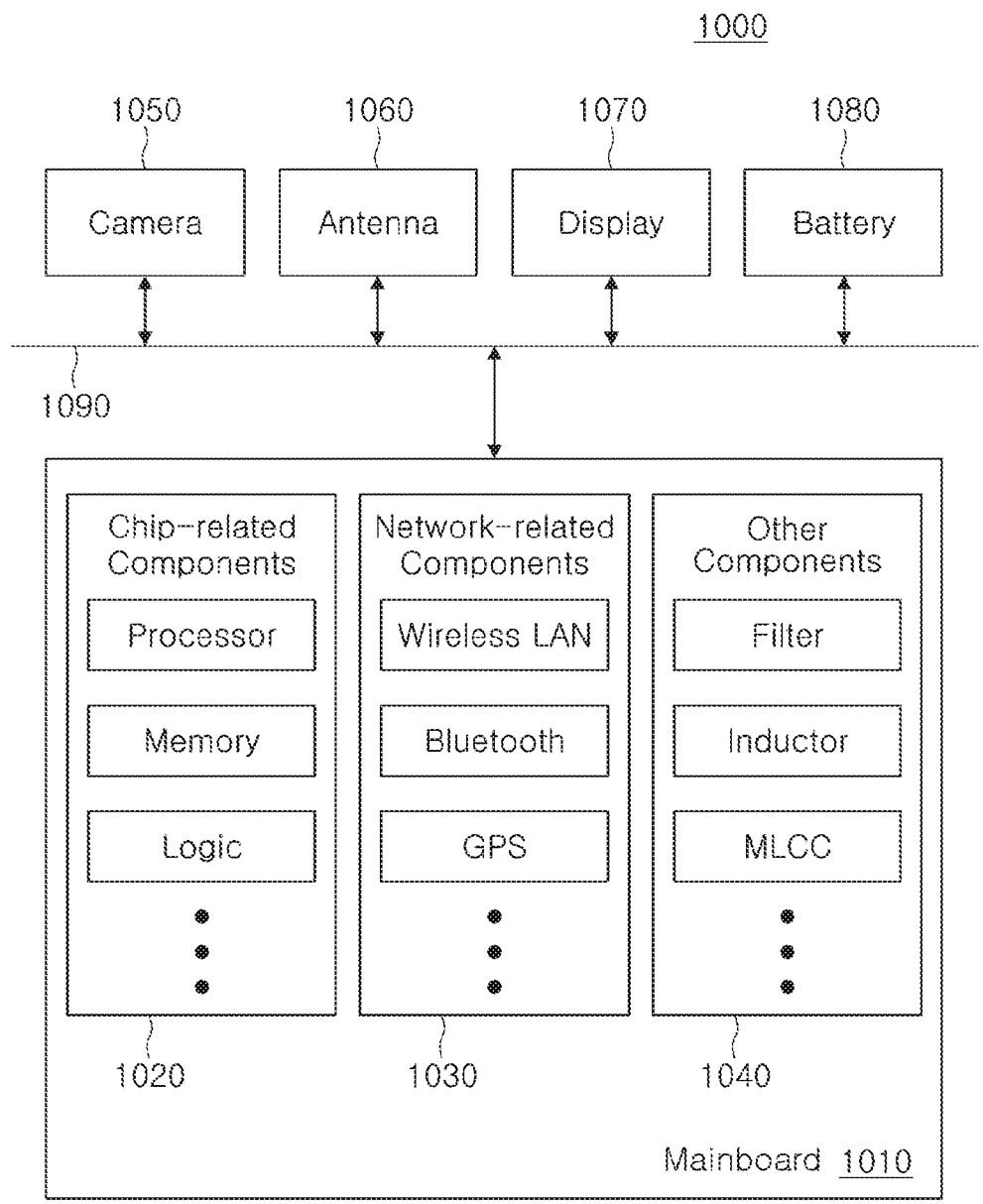
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a DRAM), a nonvolatile memory (for example, a ROM), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; a logic chip such as an analog-to-digital converter, and an application-specific integrated circuit (ASIC), or the like. However, the chip related components 1020 are not limited thereto, but may also include other types of chip related components. In addition, the chip related components 1020 may be combined with each other. The chip related components 1020 may be in the form of a package including the above-mentioned chip or electronic component.

The network related components 1030 may include components compatible with protocols such as Wi-Fi (Institute of Electrical And Electronics Engineers (IEEE) 802.11 family, or the like), WiMAX (IEEE 802.16 family, or the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, and 5G protocols, and any other wireless and wired protocols, designated after the abovementioned protocols. However, the network related components 1030 are not limited thereto, and may also include components compatible with a variety of other wireless or wired standards or protocols. In addition, the network related components 1030 may be combined with each other, together with the chip related components 1020 described above.

Other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, and the like. However, these other components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
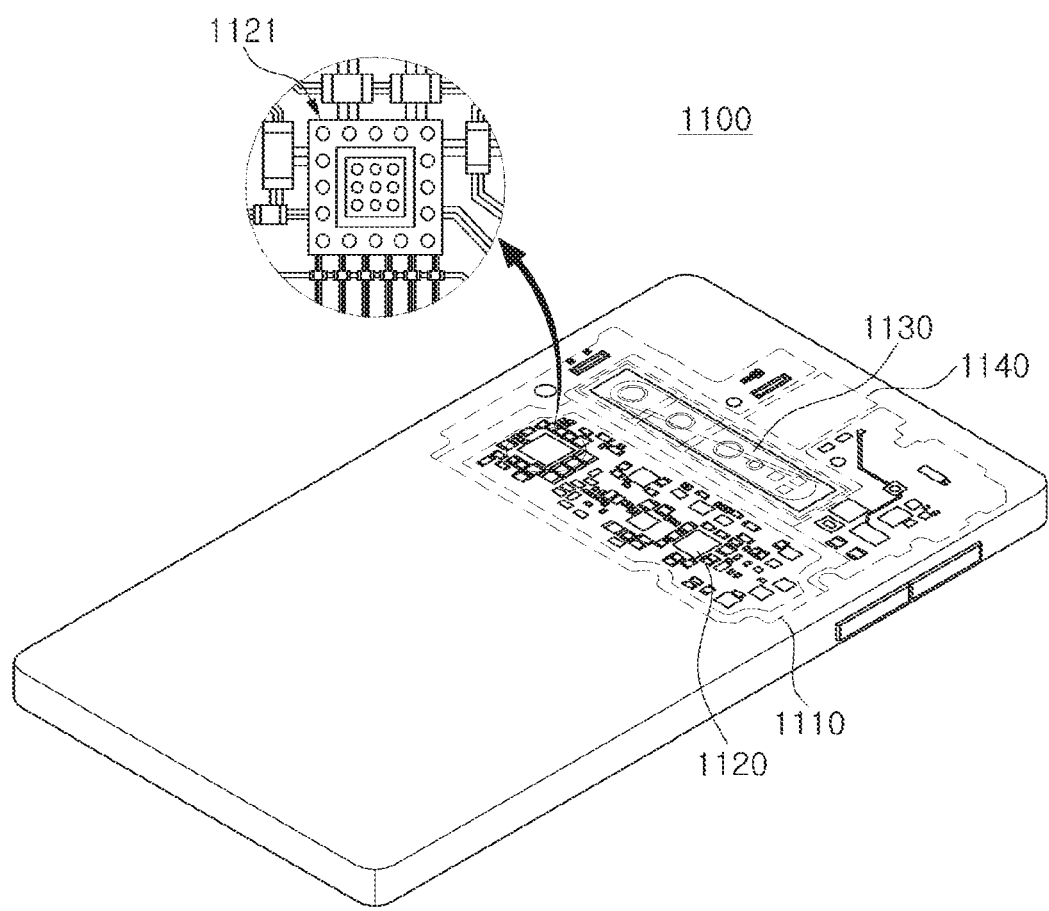
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other components that may or may not be physically or electrically connected to the mainboard 1110, such as a camera module 1130 and/or a speaker 1140, may be accommodated in the electronic device. A portion of the electronic components 1120 may be the chip related components, for example, a semiconductor package 1121, but are not limited thereto. The semiconductor package 1121 may has a form in which a semiconductor chip or a passive component is surface-mounted on a package substrate in the form of a multilayer printed circuit board or a substrate structure including the package substrate. The electronic device is not necessarily limited to the smartphone 1100, but may be other electronic devices as described above.

Figure 3:
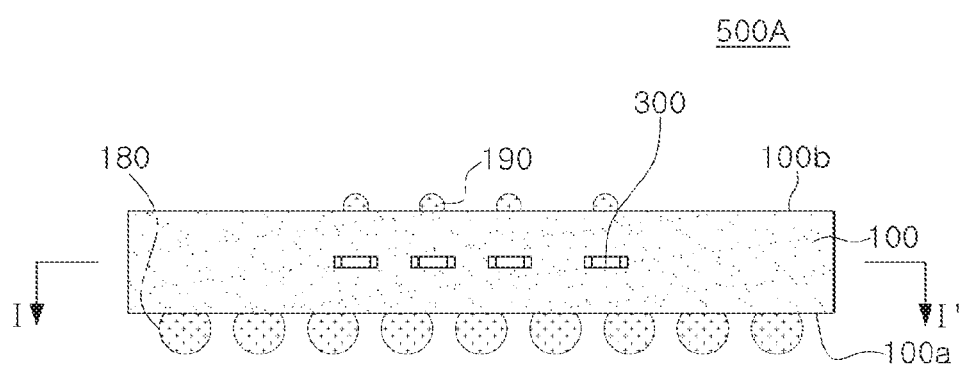
FIG. 3 is a schematic cross-sectional view illustrating an example of a substrate structure.

FIG. 3 is a schematic cross-sectional view illustrating an example of a substrate structure.

Figure 4:
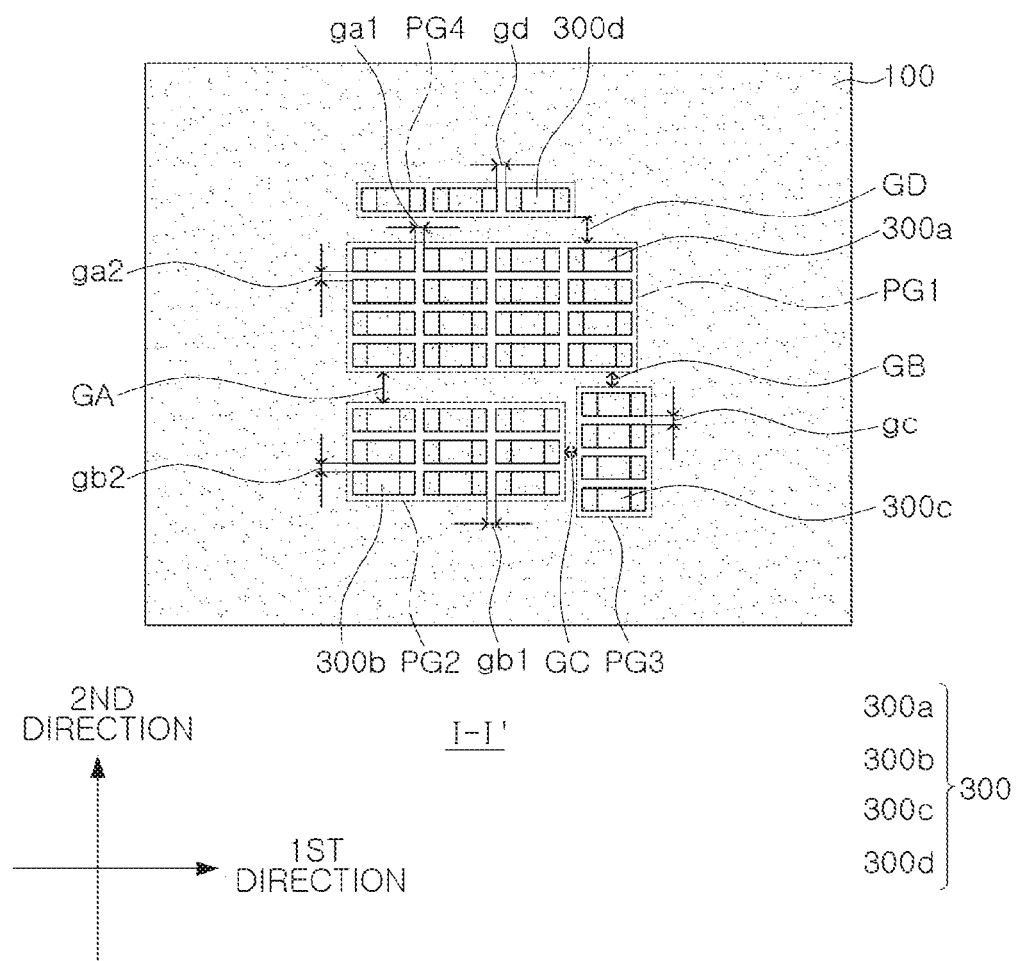
FIG. 4 is a schematic cutaway plan view, taken along line I-I' in FIG. 3, illustrating a printed circuit board of the substrate structure shown in FIG. 3.

FIG. 4 is a schematic cutaway plan view, taken along line I-I' in FIG. 3, illustrating a printed circuit board of the substrate structure in FIG. 3.

Referring to FIGS. 3 and 4, a substrate structure 500A according to an example includes a printed circuit board 100, having first and second sides 100a and 100b opposing each other, and a plurality of passive components 300. The substrate structure 500A according to an example may function as a package substrate. A printed circuit board 100 may be, for example, an embedded passive substrate (EPS), in which a plurality of passive components 300 are embedded, such that power integrity may be improved. When such an EPS structure is used, a size of the printed circuit board 100 may be additionally reduced, as compared with a land side capacitor (LSC) or a die side capacitor (DSC) (e.g., as compared with a LSC or a DSC having the passive components mounted on a surface thereof). In addition, since a distance from the semiconductor chip disposed on the printed circuit board 100 (e.g., a distance from the semiconductor chip to passive components 300 embedded in the PCB 100) may be short as compared with the equivalent distance in an embodiment using the LSC or the DSC, the EPS structure may have a better power integrity effect.

The plurality of passive components 300 includes a first group PG1 including a plurality of first passive components 300a disposed adjacent to each other, a second group PG2 including a plurality of second passive components 300b disposed adjacent to each other, a third group PG3 including a plurality of third passive components 300c disposed adjacent to each other, and a fourth group PG4 including a plurality of fourth passive components 300d disposed adjacent to each other. The number of groups among the first to fourth groups PG1 to PG4 may be adjusted. For example, the plurality of passive components 300 may include fewer groups than that those illustrated in the drawings, or may include more groups than those illustrated in the drawings.

When a plurality of passive components 300 include a plurality of passive components 300a, 300b, 300c, and 300d which may be grouped into a plurality of groups PG1, PG2, PG3, and PG4, the plurality of passive components 300a, 300b, 300c, and 300d may be selectively disposed on a plane (e.g., a same plane) to overlap a plurality of functional circuits inside of a semiconductor chip (e.g., 400) disposed on the printed circuit board 100. For example, each of the passive components 300a, 300b, 300c, and 300d, grouped into groups PG1, PG2, PG3, and PG4, may be disposed directly below a main core unit or a specific input/output unit of a semiconductor chip. Thus, a better power integrity improvement effect may be obtained.

The groups PG1, PG2, PG3, and PG4 may be determined according to the distances between adjacent passive components in each group and the distance between adjacent groups. In this regard, distances ga1 and ga2 may be defined as distances between adjacent first passive components 300a of the first group PG1 (e.g., distances in 1st and 2nd directions, respectively), and distances gb1 and gb2 may be defined as distances between adjacent second passive components 300b of the second group PG2 (e.g., distances in the 1st and 2nd directions, respectively). Among distances GA between the first and second groups PG1 and PG2, a smallest distance may be greater than at least one of a smallest distance, among distances ga1 and ga2, and a smallest distance, among distances gb1 and gb2. Among distances GB between the first and third groups PG1 and PG3, a smallest distance may be greater than at least one of a smallest distance, among distances ga1 and ga2, and a smallest distance, among distances gc between adjacent third passive components 300c of the third group PG3. Among distances GC between the second and third groups PG2 and PG3, a smallest distance may be greater than at least one of a smallest distance, among distances gb1 and gb2, and a smallest distance, among distances gc between adjacent third passive components 300c of the third group PG3. Among distances GD between the first and fourth groups PG1 and PG4, a smallest distance may be greater than at least one of a smallest distance, among the distances ga1 and ga2, and a smallest distance, among distances gd between adjacent fourth passive components 300d of the fourth group PG4.

As described above, each passive component is grouped with passive component(s) it is closest to, such that each passive component is disposed closer to another component from the same group than to any passive component from any other group.

For better grouping into groups PG1, PG2, PG3, and PG4, the plurality of first passive components 300a of the first group PG1 are arranged at regular intervals ga1, based on a first direction on a plane, and may also be arranged at regular intervals ga2, based on a second direction on the plane. In addition, the plurality of second passive components 300b of the second group PG2 may be arranged at regular intervals gb1, based on the first direction on the plane, and may also be arranged at regular intervals gb2, based on the second direction on the plane. The plurality of third passive components 300c of the third group PG3 may be arranged at regular intervals gc, based on the second direction on the plane. The plurality of fourth passive components 300d of the fourth group PG4 may be arranged at regular intervals gd, based on the first direction on the plane. The "regular interval" includes a substantially regular interval.

For better grouping into groups PG1, PG2, PG3, and PG4, among the plurality of first to fourth passive components 300a, 300b, 300c, and 300d included in the first to fourth groups PG1, PG2, PG3, and PG4, at least two passive components may be different from each other. For example, the number of the plurality of first passive components 300a of the first group PG1 may be greater than the number of the plurality of second passive components 300b of the second group PG2, the number of the plurality of third passive components 300c of the third group PG3, and the number of the plurality of fourth passive components 300d of the fourth group PG4. In addition, the number of the plurality of second passive components 300b of the second group PG2 may be greater than the number of the third passive components of the third group PG3 and the number of the fourth passive components 300d of the fourth group PG4.

Each of the plurality of passive components 300 may be a chip-type passive component, for example a chip-type capacitor or a chip-type inductor. An example of the chip-type passive component, introduced as each of the plurality of passive components 300, may be a multilayer ceramic capacitor (MLCC), a low inductance chip capacitor (LICC), or the like. Each of the plurality of passive components 300 may have two terminals. However, the number of terminals is not limited thereto, and each of the plurality of passive components 300 may have eight terminals.

The substrate structure 500A according to an example may further include a plurality of first connection metals 180 disposed on the first side 100a of the printed circuit board 100 to be connected to the first side 100a. The plurality of first connection metals 180 may overlap at least a portion of the plurality of passive components 300, when viewed from above. Each of the first connection metals 180 may be an alloy including a low melting point metal, having a lower melting point than copper (Cu), such as tin (Sn) or a tin-containing alloy. For example, each of the first connection metals 180 may be formed of a solder, but the present disclosure is not limited thereto. The first connection metal 180 may be a land, a ball, a pin, or the like, and may have a multilayer structure or single-layer structure. When the first connection metal 180 has a multilayer structure, the first connection metal 180 may include a copper pillar and a solder. When the first connection metal 180 has a single-layer structure, the first connection metal 180 may include a tin-silver solder. However, this is only an example and the present disclosure is not limited thereto.

The substrate structure 500A according to an example may further include a plurality of second connection metals 190 disposed on the second side 100b of the printed circuit board 100 to be connected to the second side 100b. A semiconductor chip, or the like, may be disposed on the second side 100b of the printed circuit board 100 through a plurality of second connection metals 190 in a surface-mounted form, as will described later. At least a portion of the plurality of second connection metals 190 may be disposed to overlap at least a portion of the plurality of passive components 300, when viewed from above. The second connection metal 190 may also include a low melting point metal having a lower melting point than copper (Cu), for example, tin (Sn) or a tin-containing alloy. For example, the second connection metal 190 may be formed of a solder, but the present disclosure is not limited thereto. The second connection metal 190 may also be a land, a ball, a pin, or the like, and may also have a multilayer structure or a single-layer structure. When the second connection metal 190 has a multilayer structure, the second connection metal 190 may include a copper pillar and a solder. When the second connection metal 190 has a single-layer structure, the second connection metal 190 may include a tin-silver solder. However, this is only an example and the present disclosure is not limited thereto.

Figure 5:
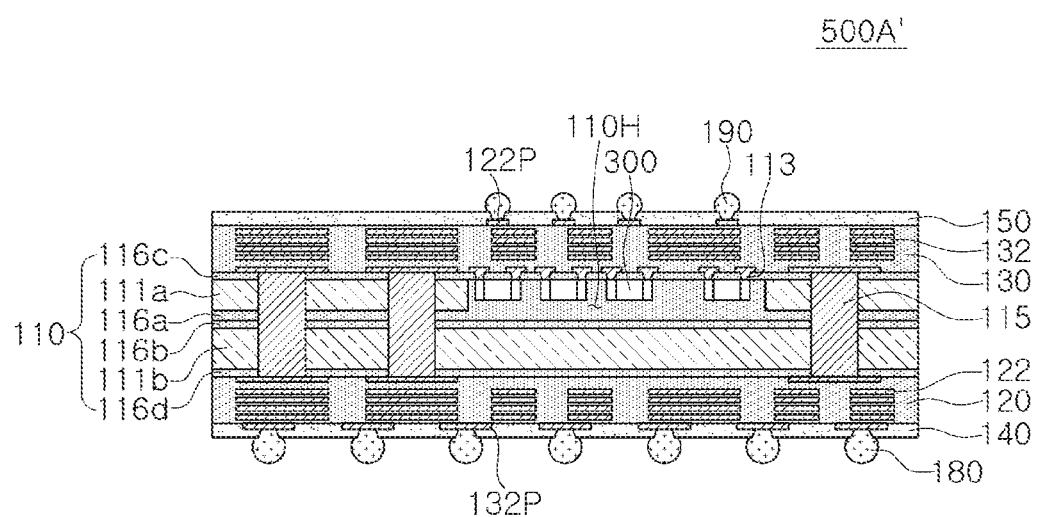
FIG. 5 is a schematic cross-sectional view illustrating a modified example of the substrate structure shown in FIG. 3.

FIG. 5 is a schematic cross-sectional view illustrating a modified example of the substrate structure in FIG. 3.

Referring to FIG. 5, in a substrate structure 500A' according to a modified example, a printed circuit board 100 may be a core-type printed circuit board. When the printed circuit board 100 is a core-type printed circuit board, it may be more advantageous in terms of warpage control of the substrate structure 500A'. In addition, it may be more advantageous to embed a plurality of passive components 300. The printed circuit board 100 is not necessarily a core-type printed circuit board, and may independently be a coreless-type printed circuit board, as desired.

The printed circuit board 100 may include a core layer 110, a first build-up layer 120 disposed on a lower side of the core layer 110, a second build-up layer 130 disposed on an upper side of the core layer 110, a plurality of first wiring layers 122 embedded in the first build-up layer 120, a plurality of second wiring layers 132 embedded in the second build-up layer 130, and a plurality of through-vias 115 penetrating through the core layer 110 and electrically connecting the plurality of first wiring layers 122 and the plurality of second wiring layers 132. The plurality of passive components 300 may be disposed in a cavity 110H penetrating through a portion of the core layer 110. The plurality of passive components 300 may be electrically connected to the plurality of first wiring layers 122 through connection vias 113 penetrating through a portion of the core layer 110. Vertically adjacent layers, disposed above and below each of the plurality of first wiring layers 122 and the plurality of second wiring layers 132, may be connected to each other through a plurality of vias penetrating through the first and second build-up layers 120 and 130. A first passivation layer 140 may be disposed on the first build-up layer 120. A second passivation layer 150 may be disposed on the second build-up layer 130. The first passivation layer 140 may have a plurality of first openings, respectively exposing a plurality of first pads 122P. A first connection metal 180 may be disposed in each of the first openings to be connected to corresponding first pads 122P. A second passivation layer 150 may have a plurality of second openings, respectively exposing the plurality of second pads 132P. A second connection metal 190 may be disposed in each of the second openings to be connected to corresponding second pads 132P.

The core layer 110 may be a core substrate, and may be disposed in a center of the printed circuit board 100. The core layer 110 may have a multilayer configuration. In this case, a better warpage control effect may be obtained and a plurality of passive components 300 may be more easily embedded. For example, the core layer 110 may include first and second insulating layers 111a and 111b and first and second bonding layers 116a and 116b disposed between the first and second insulating layers 111a and 111b. The core layer 110 may further include third and fourth bonding layers 116c and 116d, respectively disposed on the first and second insulating layers 111a and 111b. The first and second insulating layers 111a and 111b and the first to fourth bonding layers 116a, 116b, 116c, and 116d may be less numerous or more numerous than illustrated in the drawings. The cavity 110H may penetrate through the first insulating layer 111a and may be filled with the first bonding layer 116a. Each of the first and second insulating layers 111a and 111b may have a higher thickness than each of the first to fourth bonding layers 116a, 116b, 116c, and 116d. The thickness of the first bonding layer 116a refers to a thickness excluding a thickness of a portion filling the cavity 110H. Each of the insulating layers 111a and 111b, constituting the core layer 110, may have a higher thickness than each of insulating layers constituting the build-up layers 120 and 130 for the purpose of warpage control and the like, and may have improved rigidity.

A material of the first and second insulating layers 111a and 111b may be an insulating material. The insulating material may be a thermosetting resin such as an epoxy resin, a thermoplastic resin such as polyimide, or a material including the thermosetting resin and the thermoplastic resin, a glass fiber (or a glass cloth or a glass fabric, an inorganic filler, and/or a reinforcing material such as an inorganic filler, for example, a copper clad laminate (CCL), an unclad CCL, or the like. However, the material of the first and second insulating layers 111a and 111b is not limited thereto, and may be a metal plate or a glass plate, or may be a ceramic plate. Alternatively, the material of the first and second insulating layers 111a and 111b may be a liquid crystal polymer (LCP). A material of the first to fourth bonding layers 116a, 116b, 116c, and 116d may be an insulating material. In this case, the insulating material may be a thermosetting resin such as an epoxy resin, a thermoplastic resin such as polyimide, or a material including the thermosetting resin and the thermoplastic resin, a glass fiber, and/or a reinforcing material such as an inorganic filler, for example, prepreg (PPG), Ajinomoto Build-up Film (ABF), and the like.

The build-up layers 120 and 130 may provide an insulating region for forming a multilayer wiring on opposite sides adjacent to the core layer 110. Each of the build-up layers 120 and 130 may include a plurality of insulating layers, and boundaries between the plurality of insulating layers may be apparent or may not be apparent. A material of the insulating layers may be an insulating material. In this case, the insulating material may be a thermosetting resin such as an epoxy resin, a thermoplastic resin such as polyimide, or a material including the thermosetting resin and the thermoplastic resin, a glass fiber, and/or a reinforcing material such as an inorganic filler, for example, PPG, ABF, or the like. Alternatively, the material of the insulating layers may be a photoimageable dielectric (PID). On the other hand, build-up layers 120 and 130 may include the same material, or may include different materials to each other.

The wiring layers 122 and 132 may include a metal material such as copper (Cu), aluminum (Al), silver (Ag), tin (Sn), gold (Au), nickel (Ni), lead (Pb), titanium (Ti), or alloys thereof. Each of the wiring layers 122 and 132 may be formed by a process such as an additive process (AP), a semi-AP (SAP), a modified SAP (MSAP), a tenting (TT) process, or the like. As a result, each of the wiring layers 122 and 132 may include a seed layer, serving as an electroless plating layer, and an electrolytic plating layer formed based on the seed layer. The wiring layers 122 and 132 may perform various functions depending on designs thereof. For example, each of the wiring layers 122 and 132 may include a ground pattern, a power pattern, a signal pattern, and the like. The signal pattern may include various signals, other than a ground pattern, a power pattern, and the like, such as a data signal, and the like. Each pattern may include a line pattern, a plane pattern, and/or a pad pattern. A via, including a connection via 113 connected to the wiring layers 122 and 132, may also include a metal material. The via may also be formed by a plating processes such as an AP, an SAP, an MSAP, and a TT process. The via may also perform various functions depending on a design thereof. For example, the via may include a wiring via for signal connection, a wiring via for a ground connection, a wiring via for power connection, and the like. The via may be completely filled with a metal material, or a metal material may be formed along a wall of a via hole. In addition, various shapes, such as a tapered shape and the like, may be applied to the via.

The through-via 115 may penetrate through the core layer 110 and may connect the wiring layers 122 and 132, respectively disposed on a lower side and an upper side of the core layer 110, to each other. The through-via 115 may include a metal material such as copper (Cu), aluminum (Al), silver (Ag), tin (Sn), gold (Au), nickel (Ni), lead (Pb), titanium (Ti), or alloys thereof. The through-via 115 may also be formed by an AP, a SAP, a MSAP, a TT process, or the like. As a result, the through-via 115 may include a seed layer, serving as an electroless plating layer, and an electrolytic plating layer formed based on the seed layer. The through-via 115 may include a via for signal connection, a via for a ground connection, a via for power connection, and the like. The through-via 115 may have various shapes such as a cylindrical shape, an hourglass shape, and the like. As appropriate, the through-via 115 may be filled with an insulating material.

The passivation layers 140 and 150 are additional elements, and may protect an internal structure of the printed circuit board 100 from external physical and chemical damages. Each of the passivation layers 140 and 150 may include a thermosetting resin. For example, each of the passivation layers 140 and 150 may be an ABF. However, the present disclosure is not limited thereto, and each of the passivation layers 140 and 150 may be a solder resist (SR) layer. As appropriate, each of the passivation layers 140 and 150 may include a PID. Each of the passivation layers 140 and 150 may have a plurality of openings. A surface treatment layer may be formed on surfaces of the pads 122P and 132P exposed through the plurality of openings. The surface treatment layer may be formed by, for example, electrolytic gold plating, electroless gold plating, organic solderability preservative (OSP) or electroless tin plating, electroless silver plating, electroless nickel plating/substitution gold plating, direct immersion gold (DIG) plating, hot air solder leveling (HASL), or the like. Optionally, each of the openings may have a plurality of via holes. Optionally, an underbump metal (UBM) may be disposed on each of the openings to improve reliability.

The connection metals 180 and 190 are additional elements which may physically and/or electrically connect the printed circuit board 100 to an external entity. For example, the printed circuit board 100 may be mounted on another mainboard, or the like, through the first connection metal 180. In addition, a semiconductor chip, or the like, may be surface-mounted on the printed circuit board 100 through the second connection metal 190. The connection metals 180 and 190 may be disposed on a plurality of openings of the passivation layers 140 and 150, respectively. The connection metals 180 and 190 may include a low melting point metal, having a lower melting point than copper (Cu), such as tin (Sn) or a tin-containing alloy. For example, the connection metals 180 and 190 may be formed of a solder. However, this is only an example and the material of the connection metals 180 and 190 is not limited thereto.

Each of the connection metals 180 and 190 may be a land, a ball, a pin, or the like. The connection metals 180 and 190 may have a multilayer structure or a single-layer structure. When having a multilayer structure, each of the connection metals 180 and 190 may include a copper pillar and a solder. When having a single-layer structure, each of the connection metals 180 and 190 may include a tin-silver solder. However, this is only an example and the present disclosure is not limited thereto. The number, interval, disposition form, and the like, of the connection metals 180 and 190 are not necessarily limited, and may be sufficiently modified depending on designs particulars.

The passive component(s) 300 is disposed in the cavity 110H of the core layer 110. For example, the passive component 300 may be disposed in the cavity 110H, formed in the first insulating layer 111a, to be covered with the first bonding layer 116a. The passive component 300 may be a chip-type passive component, for example, a chip-type capacitor or a chip-type inductor. An example of chip-type capacitor may be an MLCC, an LICC, or the like. Each of the plurality of passive components 300 may have two terminals. However, the number of terminals is not limited thereto, and each of the plurality of passive components 300 may have eight terminals, or the like.

Figure 6:
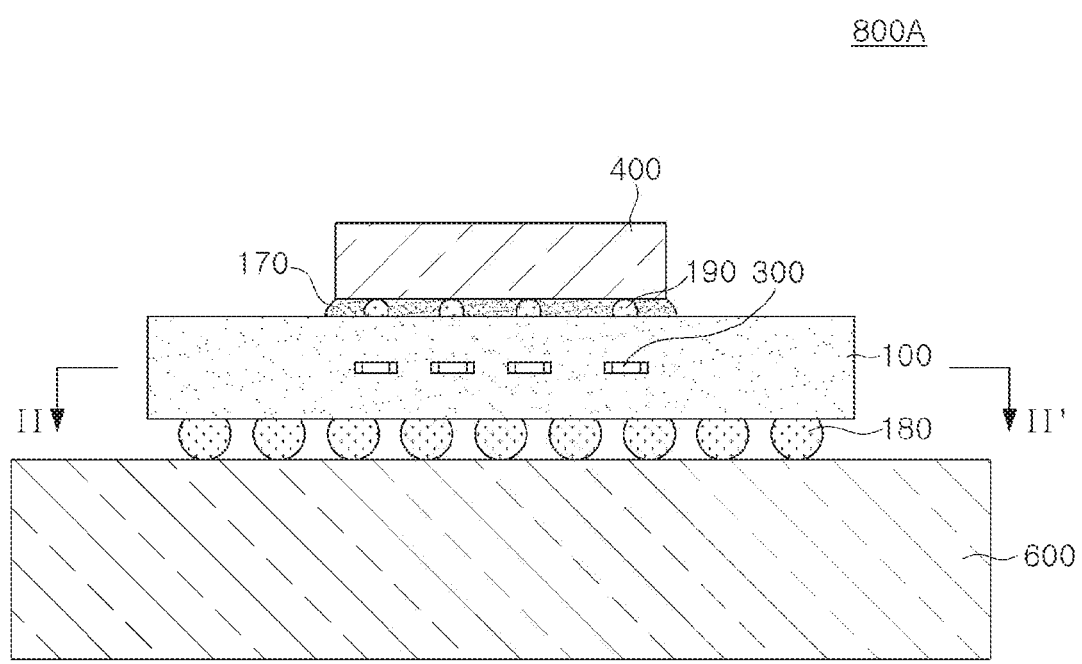
FIG. 6 is a schematic cross-sectional view illustrating an example of an electronic device including the substrate structure shown in FIG. 3.

FIG. 6 is a schematic cross-sectional view illustrating an example of an electronic device including the substrate structure in FIG. 3.

Referring to FIG. 6, an electronic device 800A according to an example includes a mainboard 600, a printed circuit board 100 disposed on the mainboard 600, a semiconductor chip 400 disposed on the printed circuit board 100, and a plurality of passive components 300 embedded in the printed circuit board 100. The printed circuit board 100 may be connected to the mainboard 600 through a plurality of first connection metals 180. The semiconductor chip 400 may be connected to the printed circuit board 100 through a plurality of second connection metals 190. An underfill resin 170 may be disposed between the printed circuit board 100 and the semiconductor chip 400 to cover at least a portion of the plurality of second connection metals 190. In the following description, most of the same contents as described above will be omitted to avoid duplicate description.

The mainboard 600 provides a physical and/or electrical connection path and a disposition place of various electronic components in the electronic device 800A. The mainboard 600 may be any one of various types of printed circuit boards. The mainboard 600 may be a multilayer printed circuit board (a multilayer PCB). The mainboard 600 may be a rigid PCB or a rigid-flexible PCB. Various types of electronic components may be embedded in the mainboard 600. In addition to the above-described substrate structure, various electronic components may be disposed on the mainboard 600.

The semiconductor chip 400 may be an integrated circuit (IC) providing an amount of several hundreds to several millions of elements or more integrated in a single chip. An integrated circuit, constituting the semiconductor chip 400, may be, for example, an application processor chip, but is not limited thereto. The semiconductor chip 400 may be an integrated circuit in a bare state in which an additional bump or wiring layer is not formed. However, the semiconductor chip 400 is not limited thereto and, optionally, may be a packaged-type integrated circuit. The integrated circuit may be formed based on an active wafer. In this case, a base material of a body of the semiconductor chip 400 may be silicon (Si), germanium (Ge), gallium arsenide (GaAs), or the like. Various circuits may be formed on the body. The semiconductor chip 400 may be connected to other elements through a connection pad, and a material of the connection pad may be a conductive material such as copper (Cu), aluminum (Al), or the like. A passivation layer, not illustrated, may be formed on the body to expose the connection pad, and may be an oxide layer, a nitride layer, or the like, or a double layer of an oxide layer and a nitride layer. An insulating layer, and the like, may be further disposed in other appropriate locations. In the semiconductor chip 400, a surface on which a connection pad is disposed may be an active surface, and a rear surface opposing the active surface may be an inactive surface. However, according to cases, the connection pad may also be disposed on the rear surface, such that both surfaces may be active surfaces.

Figure 7:
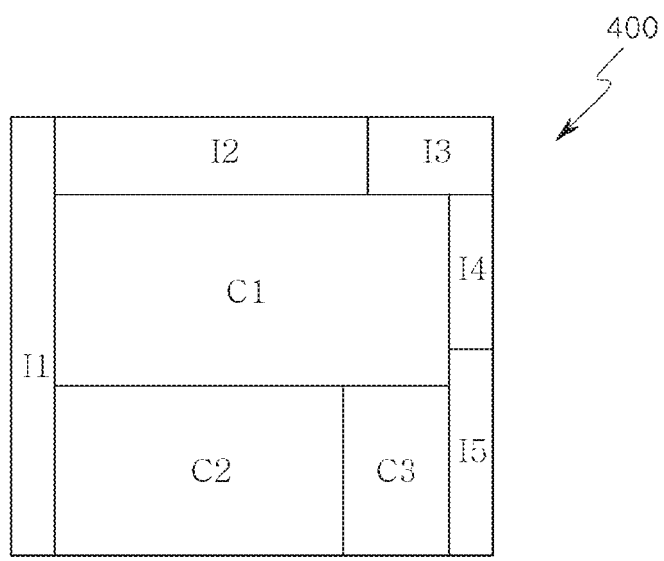
FIG. 7 is a schematic plan view illustrating a disposition of functional circuits inside of a semiconductor chip of the electronic device shown in FIG. 6.

FIG. 7 is a schematic plan view illustrating a disposition of functional circuits inside of a semiconductor chip of the electronic device in FIG. 6.

Referring to FIG. 7, a semiconductor chip 400 includes a plurality of functional circuits C1, C2, C3, I1, I2, I3, I4, and I5. For example, the semiconductor chip 400 may include a core circuit unit C1, C2, and C3 and input/output circuit unit (interface units) I1, I2, I3, I4, and I5. However, the present disclosure is not limited thereto, and the semiconductor chip 400 may further include an interface unit, a memory unit, and the like. The core circuit units C1, C2, and C3 may include at least one of a central processing unit (CPU), a graphics processing unit (GPU), a digital signal processor unit (DSPU), an image signal processing unit (ISPU), and a neural processing unit (NPU). The semiconductor chip 400 including such internal functional circuit units may be, for example, an application processor chip, but is not limited thereto. Most of the other contents are substantially the same as described above, and thus, duplicate descriptions are omitted.

Figure 8:
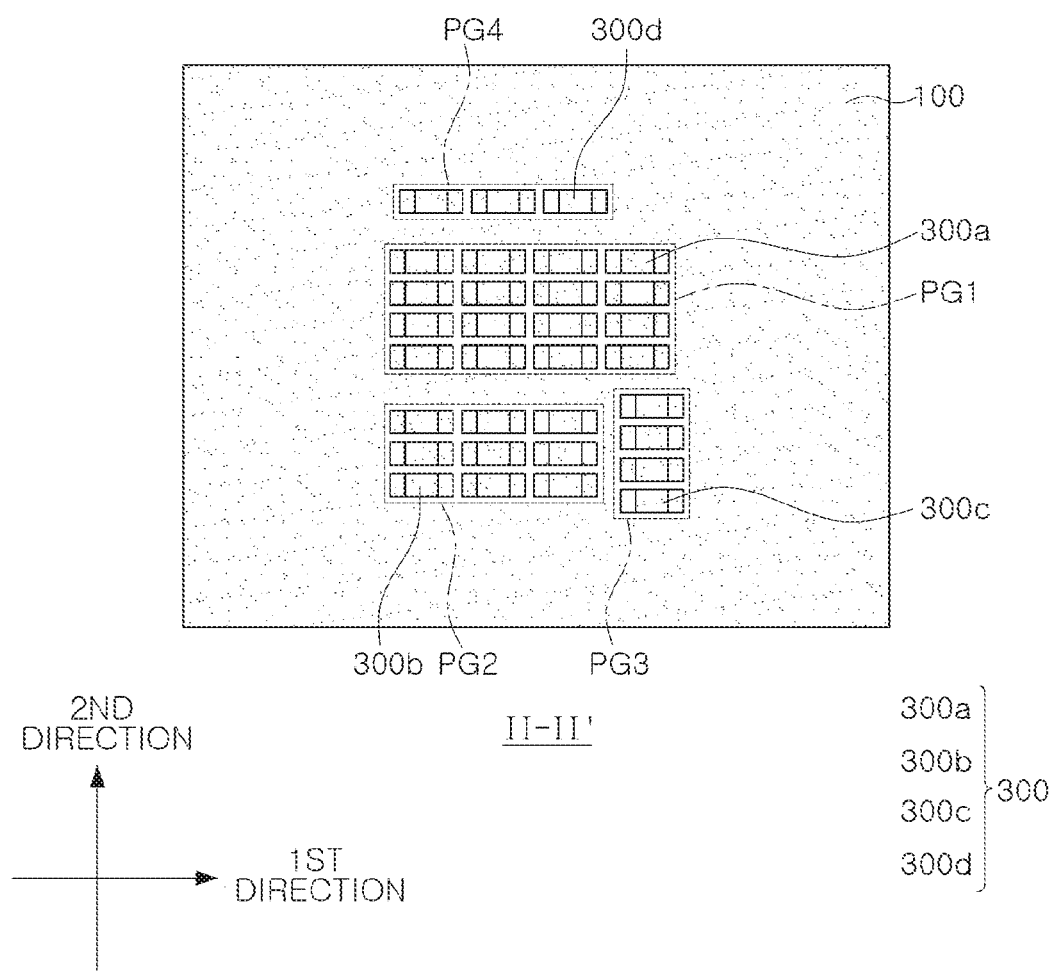
FIG. 8 is a schematic cutaway plan view, taken along line II-II' in FIG. 6, illustrating a printed circuit board of the substrate structure shown in FIG. 6.

FIG. 8 is a schematic cutaway plan view, taken along line II-II' in FIG. 6, illustrating a printed circuit board of the substrate structure in FIG. 6.

Referring to FIG. 8, a plurality of passive components 300 include a first group PG1 including a plurality of first passive components 300a adjacent to each other, a second group PG2 including a plurality of second passive components 300b adjacent to each other, a third group PG3 including a plurality of third passive components 300c adjacent to each other, and a fourth group PG4 including a plurality of fourth passive components 300d adjacent to each other. The number of groups among the first group PG1 to the fourth group PG4 may be adjusted. For example, the plurality of passive components 300 may include fewer groups than those illustrated in the drawings, or may include more groups than those illustrated in the drawings. Most of the details thereof are the same as described above, and detailed description thereof is omitted.

Figure 9:
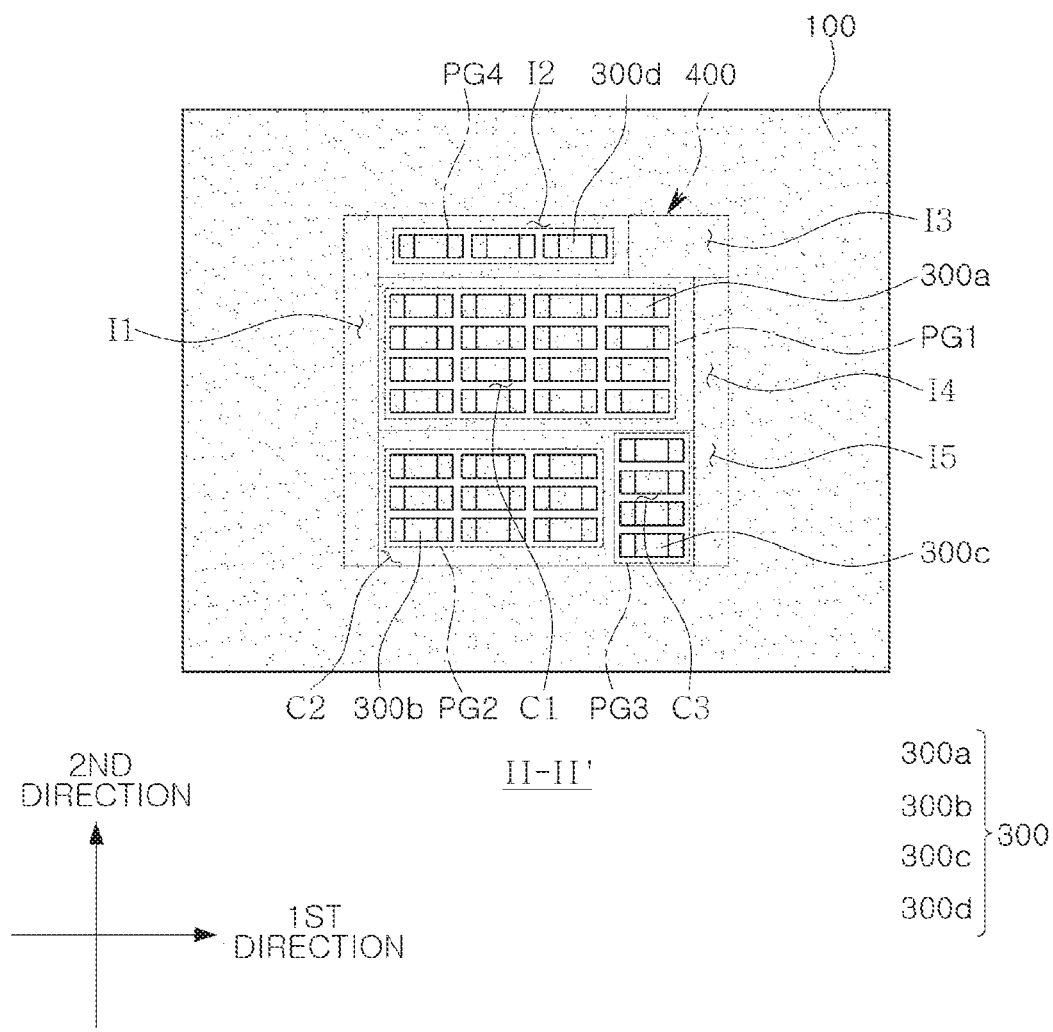
FIG. 9 is a schematic plan view provided such that the disposition of functional circuits inside of the semiconductor chip shown in FIG. 7 overlaps the schematic cutaway plan view of FIG. 8, taken along line II-II' in FIG. 6, illustrating the printed circuit board shown in FIG. 6.

FIG. 9 is a schematic plan view provided such that the disposition of the functional circuit(s) inside of the semiconductor chip as shown in FIG. 7 overlaps the schematic cutaway plan view of FIG. 8, taken along line II-II' in FIG. 6, illustrating the printed circuit board in FIG. 6.

Referring to FIG. 9, at least a portion of a plurality of passive components 300a, 300b, 300c, and 300d grouped into groups PG1, PG2, PG3, and PG4 of a plurality of passive components 300 may be disposed to overlap at least one of the plurality of functional circuit units C1, C2, C3, I1, I2, I3, I4, and I5 of the semiconductor chip 400, when viewed from above. For example, the first group PG1 may be disposed directly below the first core functional circuit unit C1 (e.g., all passive components of the first group PG1 may be disposed directly below the first core unit C1, and/or no components of any group other than the first group PG1 may be disposed directly below the first core unit C1). The second group PG2 may be disposed directly below the second core functional circuit unit C2 (e.g., all passive components of the second group PG2 may be disposed directly below the second core unit C2, and/or no components of any group other than the second group PG2 may be disposed directly below the second core unit C2). The third group PG3 may be disposed directly below the third core functional circuit unit C3 (e.g., all passive components of the third group PG3 may be disposed directly below the third core unit C3, and/or no components of any group other than the third group PG3 may be disposed directly below the third core unit C3). As described above, when a plurality of passive components 300a, 300b, and 300c grouped into the groups PG1, PG2, and PG3 are disposed directly below the core functional circuit units C1, C2, and C3, a better power integrity improvement effect may be obtained. Additionally, the fourth group PG4 may be disposed directly below an input/output unit I2 having a relatively larger area than each of the other input/output units I1, I3, I4, and I5 (e.g., all passive components of the fourth group PG4 may be disposed directly below the input/output unit I2, and/or no components of any group other than the fourth group PG4 may be disposed directly below the input/output unit I2). Most of the other contents are substantially the same as described above, and thus, duplicate descriptions are omitted.

In one example, the first group PG1 may be disposed directly below the first core unit C1, and passive components of the first group PG1 may be electrically connected to circuitry of the first core unit C1 (e.g., via one or more pads disposed directly below the first core unit C1). The second group PG2 may be disposed directly below the second core unit C2, and passive components of the second group PG2 may be electrically connected to circuitry of the second core unit C2 (e.g., via one or more pads disposed directly below the second core unit C2). The third group PG3 may be disposed directly below the third core unit C3, and passive components of the third group PG3 may be electrically connected to circuitry of the third core unit C3 (e.g., via one or more pads disposed directly below the third core unit C3). As described above, when a plurality of passive components 300a, 300b, and 300c grouped into the groups PG1, PG2, and PG3 are disposed directly below the core functional circuit units C1, C2, and C3 to which they are electrically connected, a better power integrity improvement effect may be obtained. Additionally, the fourth group PG4 may be disposed directly below an input/output unit I2 having a relatively larger area than each of the other input/output functional circuit units I1, I3, I4, and I5, and passive components of the fourth group PG4 may be electrically connected to circuitry of the input/output unit I2 (e.g., via one or more pads disposed directly below the input/output unit I2). Most of the other contents are substantially the same as described above, and thus, duplicate descriptions are omitted.

Figure 10:
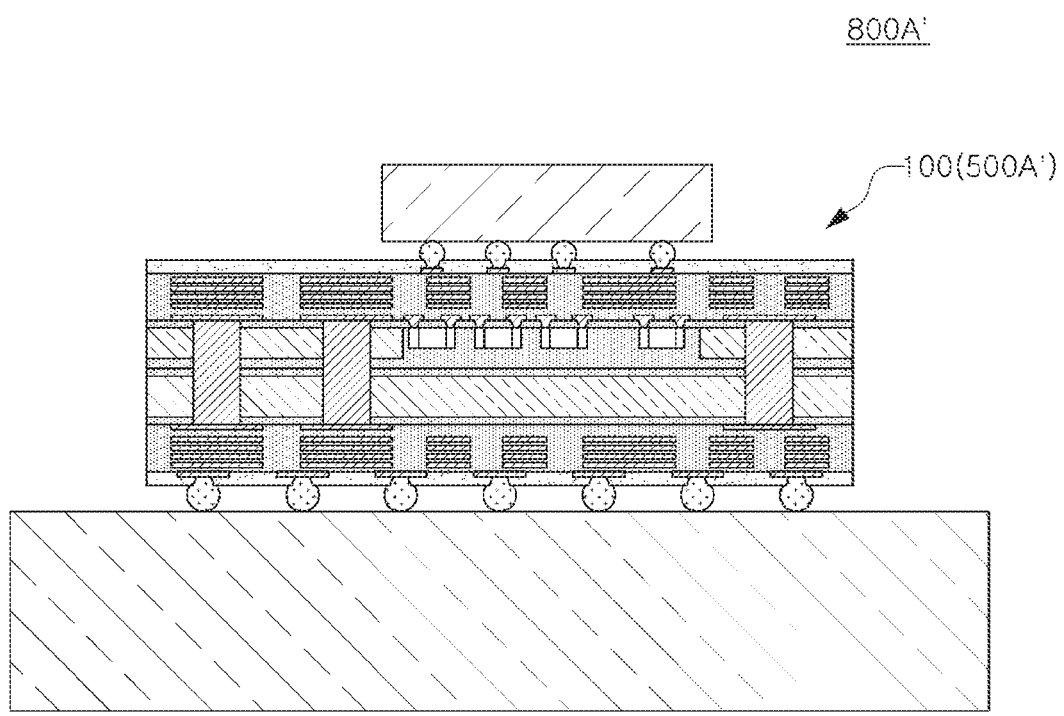
FIG. 10 is a schematic cross-sectional view illustrating a modified example of the electronic device shown in FIG. 6.

FIG. 10 is a schematic cross-sectional view illustrating a modified example of the electronic device shown in FIG. 6.

Referring to FIG. 10, an electronic device 800A' according to a modified example includes a substrate structure 500A' according to the modified example. For example, a printed circuit board 100 may be a core-type printed circuit board including a multilayer core layer. Most of the other contents are substantially the same as described above, and thus, duplicate descriptions are omitted.

Figure 11:
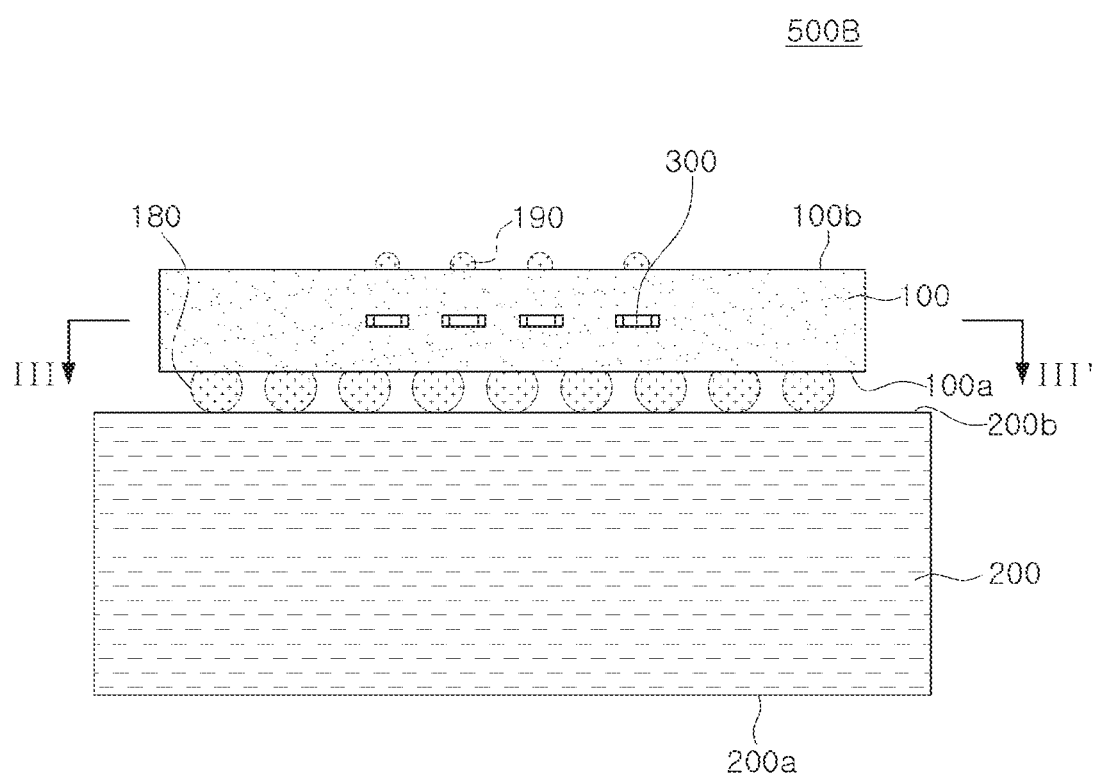
FIG. 11 is a schematic cross-sectional view illustrating another example of the substrate structure.

FIG. 11 is a schematic cross-sectional view illustrating another example of the substrate structure.

Figure 12:
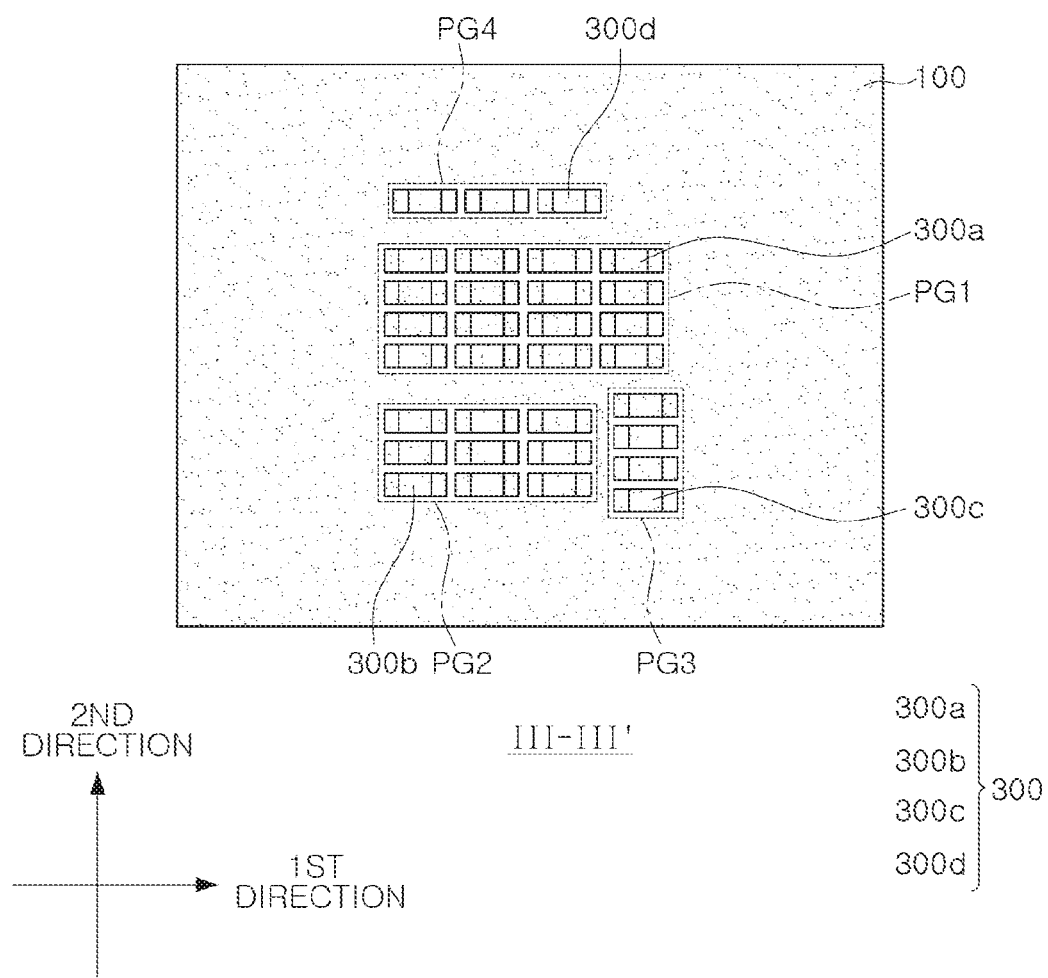
FIG. 12 is a schematic cutaway view, taken along line III-III' in FIG. 11, illustrating a first printed circuit board of the substrate structure shown in FIG. 11.

FIG. 12 is a schematic cutaway view, taken along line III-III' in FIG. 11, illustrating a first printed circuit board of the substrate structure in FIG. 11.

Referring to FIGS. 11 and 12, a substrate structure 500B according to another example includes a second printed circuit board 200 having third and fourth sides 200a and 200b opposing each other, a first printed circuit board 100 disposed on a fourth side 200b of the second printed circuit board 200 and having first and second sides 100a and 100b opposing each other, and a plurality of passive components 300 embedded in the first printed circuit board 100. The substrate structure 500B according to another example may have a substrate-on-substrate structure and may function as a package substrate. In the following description, most of the same contents as described above will be omitted.

As described above, the substrate structure 500B according to another example has a structure, in which the first and second printed circuit boards 100 and 200 are stacked, to keep up with a high-multilayer and large-scale substrate. Therefore, as compared with the case in which a high-multilayer and large-scale substrate is manufactured through only a single printed circuit board, technical difficulty may be lowered and yield may be increased. As a result, costs may be reduced. Moreover, wiring designs of the first printed circuit board 100 and the second printed circuit board 200 are different from each other, and thus, an optimized wiring design may be implemented. As a result, better performance may be obtained.

In addition, a substrate structure 500B according to another example includes a plurality of passive components 300 embedded in a first printed circuit board 100. The first printed circuit board 100, in which the plurality of passive components 300 are embedded, may be, for example, an embedded passive substrate (EPS), and thus, integrity may be improved. When such an EPS is used, a size of the first printed circuit board 100 may be additionally reduced, as compared with the case in which an LSC or DSC is disposed. In addition, since a distance from a semiconductor chip, disposed on the first printed circuit board 100, may be short as compared with that of the LSC or DSC, a better power integrity improvement effect may be obtained.

The plurality of passive components 300 includes a first group PG1 including a plurality of first passive components 300a disposed adjacent to each other, a second group PG2 including a plurality of second passive components 300b disposed adjacent to each other, a third group PG3 including a plurality of third passive components 300c disposed adjacent to each other, and a fourth group PG4 including a plurality of fourth passive components 300d disposed adjacent to each other. The number of the first to fourth groups PG1 to PG4 may be adjusted as appropriate. For example, the plurality of passive components 300 may include fewer groups than those illustrated in the drawings, or may include more groups than those illustrated in the drawings.

When a plurality of passive components 300 include a plurality of passive components 300a, 300b, 300c, and 300d which may be grouped into a plurality of groups PG1, PG2, PG3, and PG4, the plurality of passive components 300a, 300b, 300c, and 300d may be selectively disposed on a plane to overlap a plurality of functional circuit units inside of a semiconductor chip 400 disposed on the printed circuit board 100, as will be described below. For example, each of the passive components 300a, 300b, 300c, and 300d, grouped into groups PG1, PG2, PG3, and PG4, may be disposed directly below a main core functional circuit unit or a specific input/output functional circuit unit of a semiconductor chip. Thus, a better power integrity improvement effect may be obtained.

The second printed circuit board 200 may have a larger scale than the first printed circuit board 100. For example, the second printed circuit board 200 may have a higher thickness than the first printed circuit board 100. In addition, the second printed circuit board 200 may have a larger planar area than the first printed circuit board 100. In a non-limiting example, the second printed circuit board 200 may be a high-density interconnection (HDI) interposer substrate, and the first printed circuit board 100 may be a flip-chip ball grid array (FCBGA) substrate. The wiring layer in the first printed circuit board 100 may mainly serve to transmit a signal, and the wiring layer in the second printed circuit board 200 may mainly provide power and grounding.

The substrate structure 500B according to another example may further include a plurality of first connection metals 180 disposed between a fourth side 200b of the second printed circuit board 200 and a first side 100a of the first printed circuit board 100 to connect the fourth side 200b of the second printed circuit board 200 and the first side 100a of the first printed circuit board 100 to each other. The plurality of first connection metals 180 may overlap at least a portion of each of the plurality of passive components 300, when viewed from above. The substrate structure 500B may further include a second printed circuit board disposed on the second side 100b to be connected thereto. As will be described later, a semiconductor chip, or the like, may be disposed on the second side 100b of the first printed circuit board 100 through a plurality of second connection metals 190 in surface-mounted form. At least a portion of the plurality of second connection metals 190 may be disposed to overlap at least a portion of the plurality of passive components 300, when viewed from above.

The substrate structure 500B according to another example may further include a plurality of third connection metals 290 (see, e.g., FIG. 13) disposed on the third side of the second printed circuit board 200. As described later, the substrate structure 500B may be disposed on a mainboard, or the like, to be connected thereto. Each of the third connections metal 290 may also include a low melting point metal having a lower melting point than copper (Cu), for example, tin (Sn) or a tin-containing alloy. For example, each of the third connection metals 290 may be formed of a solder, but the present disclosure is not limited thereto. Each of the third connection metals 290 may also be a land, a ball, a pin, or the like, and may have a multilayer structure or a single-layer structure. When having a multilayer structure, each of the third connection metals 290 may include a copper pillar and solder. When having a single-layer structure, each of the third connection metals 290 may include a tin-silver solder, but this is only an example and the present disclosure is not limited thereto.

Optionally, the substrate structure 500B according to another example may further include an underfill resin 160 (see, e.g., FIG. 14) disposed between the first side 100a of the first printed circuit board 100 and the fourth side 200b of the second printed circuit board 200 and covering at least a portion of the plurality of first connection metals 180. A material of the underfill resin 160 may be an insulating adhesive such as an epoxy resin, but is not limited thereto. Other materials, each functioning as an underfill, may be used as the material of the underfill resin 160.

Figure 13:
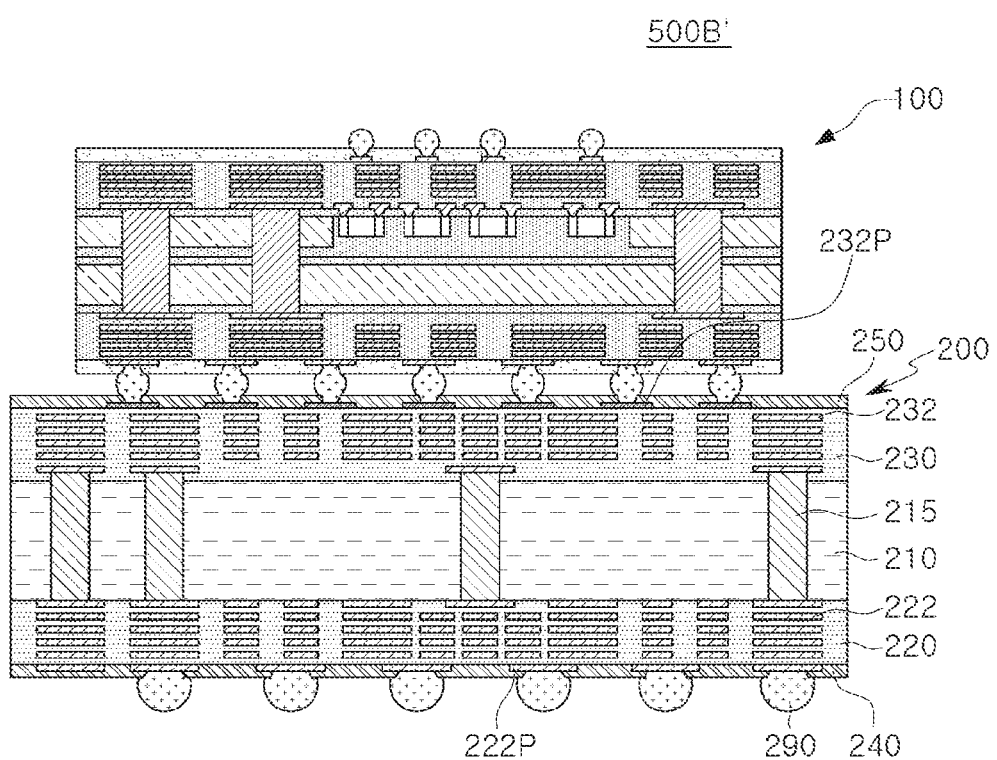
FIG. 13 is a schematic cross-sectional view illustrating a modified example of the substrate structure shown in FIG. 11.

FIG. 13 is a schematic cross-sectional view illustrating a modified example of the substrate structure in FIG. 11.

Referring to FIG. 13, in a substrate structure 500B' according to a modified example, a first printed circuit board 100 may be a core-type printed circuit board. In addition, a second printed circuit board 200 may also be a core-type printed circuit board. When each of the first and second printed circuit boards 100 and 200 is a core-type printed circuit board, it may be more advantageous in terms of warpage control of the substrate structure 500A'. In addition, it may be more advantageous to embed a plurality of passive components 300. In addition, it may be more advantageous in implementing a high-density interconnection (HDI). Hereinafter, most of the other contents are substantially the same as described above, and thus, duplicate descriptions are omitted. Each of the first and second printed circuit board 100 and 200 is not necessarily a core-type printed circuit board, and may independently be a coreless-type printed circuit board.

The second printed circuit board 200 may include a core layer 210, a third build-up layer 220 disposed on a lower side of the second core layer 210, a fourth build-up layer 230 disposed on an upper side of the second core layer 210, a plurality of third wiring layers 222 embedded in the third build-up layer 220, a plurality of fourth wiring layers 232 embedded in the fourth build-up layer 230, and a plurality of second through-vias 215 penetrating through the second core layer 210 and electrically connecting the plurality of third wiring layers 222 and the plurality of fourth wiring layers 232. Vertically adjacent layers, disposed above and below each of the plurality of third wiring layers 222 and the plurality of fourth wiring layers 232, may be connected to each other through a plurality of vias penetrating through the second and fourth build-up layers 220 and 230. A third passivation layer 240 may be disposed on the third build-up layer 220. A fourth passivation layer 250 may be disposed on the fourth build-up layer 230. The third passivation layer 240 may have a plurality of first openings, respectively exposing a plurality of third pads 222P. A third connection metal 290 may be disposed in each of the third openings to be connected to a third pad 222P. The fourth passivation layer 250 may have a plurality of second openings, respectively exposing a plurality of fourth pads 232P. A fourth connection metal 280 may be disposed in each of the fourth openings to be connected to a fourth pad 232P.

The core layer 210 may be a core substrate, disposed in a center of the second printed circuit board 200. A material of the core layer 210 may be an insulating material. The insulating material may be a thermosetting resin such as an epoxy resin, a thermoplastic resin such as polyimide, or a material including the thermosetting resin and the thermoplastic resin, a glass fiber and/or a reinforcing material such as an inorganic filler, for example, a copper clad laminate (CCL), an unclad CCL, or the like. However, the material of the core layer 210 is not limited thereto, and may be a metal plate or a glass plate, or may also be a ceramic plate. Optionally, the material of the first and second insulating layers 111a and 111b may be a liquid crystal polymer (LCP). The core layer 210 may have a higher thickness than each of the insulating layers constituting the build-up layers 220 and 230, for the purpose of warpage control, and the like, and may have improved rigidity.

The build-up layers 220 and 230 may provide an insulating region for forming a multilayer wiring on opposite sides adjacent to the second core layer 210. Each of the build-up layers 220 and 230 may include a plurality of insulating layers, and boundaries between the plurality of insulating layers may be apparent or may not be apparent. A material of the insulating layers may be an insulating material. In this case, the insulating material may be a thermosetting resin such as an epoxy resin, a thermoplastic resin such as polyimide, or a mixed material of the thermosetting resin and the thermoplastic resin, a glass fiber, and/or a reinforcing material such as an inorganic filler, for example, PPG, ABF, or the like. Optionally, the material of the insulating layers may be a PID. On the other hand, build-up layers 220 and 230 may include the same material, or may include different materials to each other.

The wiring layers 222 and 232 may include a metal material such as copper (Cu), aluminum (Al), silver (Ag), tin (Sn), gold (Au), nickel (Ni), lead (Pb), titanium (Ti), or alloys thereof. Each of the wiring layers 222 and 232 may be formed by a process such as an AP, an SAP, an MSAP, a TT process, or the like. As a result, each of the wiring layers 222 and 232 may include a seed layer, serving as an electroless plating layer, and an electrolytic plating layer formed based on the seed layer. The wiring layers 222 and 232 may perform various functions depending on a design thereof. For example, each of the wiring layers 222 and 232 may include a ground pattern, a power pattern, a signal pattern, and the like. The signal pattern may include various signals, other than a ground pattern, a power pattern, and the like, such as a data signal, and the like. Each pattern may include a line pattern, a plane pattern, and/or a pad pattern. A via, including a connection via connected to the wiring layers 222 and 232, may also include a metal material. The via may also be formed by a plating processes such as an AP, an SAP, an MSAP, and a TT process. The via may also perform various functions depending on a design thereof. For example, the via may include a wiring via for signal connection, a wiring via for a ground connection, a wiring via for power connection, and the like. The via may be entirely filled with a metal material, or a metal material may be formed along a wall of a via hole. In addition, various shapes, such as a tapered shape and the like, may be applied to the via.

The through-via 215 may penetrate through the core layer 210 and may connect the wiring layers 222 and 232, respectively disposed on a lower side and an upper side of the core layer 210, to each other. The through-via 215 may include a metal material such as copper (Cu), aluminum (Al), silver (Ag), tin (Sn), gold (Au), nickel (Ni), lead (Pb), titanium (Ti), or alloys thereof. The through-via 215 may also be formed by an AP, a SAP, a MSAP, a TT process, or the like. As a result, the through-via 215 may include a seed layer, serving as an electroless plating layer, and an electrolytic plating layer formed based on the seed layer. The through-via 215 may include a via for signal connection, a via for a ground connection, a via for power connection, and the like. The through-via 215 may have various shapes such as a cylindrical shape, an hourglass shape, and the like. Optionally, the through-via 215 may be filled with an insulating material.

The passivation layers 240 and 250 are additional elements, and may protect an internal structure of the printed circuit board 100 from external physical and chemical damages. Each of the passivation layers 240 and 250 may include a thermosetting resin. For example, each of the passivation layers 240 and 250 may be an ABF. However, the present disclosure is not limited thereto, and each of the passivation layers 240 and 250 may be a SR layer. Optionally, each of the passivation layers 240 and 250 may include a PID. Each of the passivation layers 240 and 250 may have a plurality of openings. A surface treatment layer may be formed on surfaces of the pads 222P and 232P exposed through the plurality of openings. The surface treatment layer may be formed by, for example, electrolytic gold plating, electroless gold plating, OSP or electroless tin plating, electroless silver plating, electroless nickel plating/ substitution gold plating, DIG plating, HASL, or the like. Optionally, each of the openings may have a plurality of via holes. Optionally, an underbump metal (UBM) may be disposed on each of the openings to improve reliability.

The third connection metal 290 is an additional element which may physically and/or electrically connect the second printed circuit board 200 to an external entity. For example, the second printed circuit board 200 may be mounted on another board such as a mainboard, or the like, through the third connection metal 290. The third connection metal 290 may be disposed on each of the plurality of openings of the passivation layers 240 and 250. The third connection metal 290 may include a low melting point metal, having a lower melting point than copper (Cu), such as tin (Sn) or a tin-containing alloy. For example, the third connection metals 290 may be formed of a solder. However, this is only an example and the material of the third connection metal 290 is not limited thereto. The third connection metal 290 may be a land, a ball, a pin, or the like. The third connection metal 290 may have a multilayer structure or a single-layer structure. When having a multilayer structure, each of the connection metals 290 may include a copper pillar and a solder. When having a single-layer structure, the third connection metals 290 may include a tin-silver solder. However, this is only an example and the present disclosure is not limited thereto. The number, interval, disposition form, and the like, of the third connection metals 290 are not necessarily limited, and may be sufficiently modified depending on design particulars.

Figure 14:
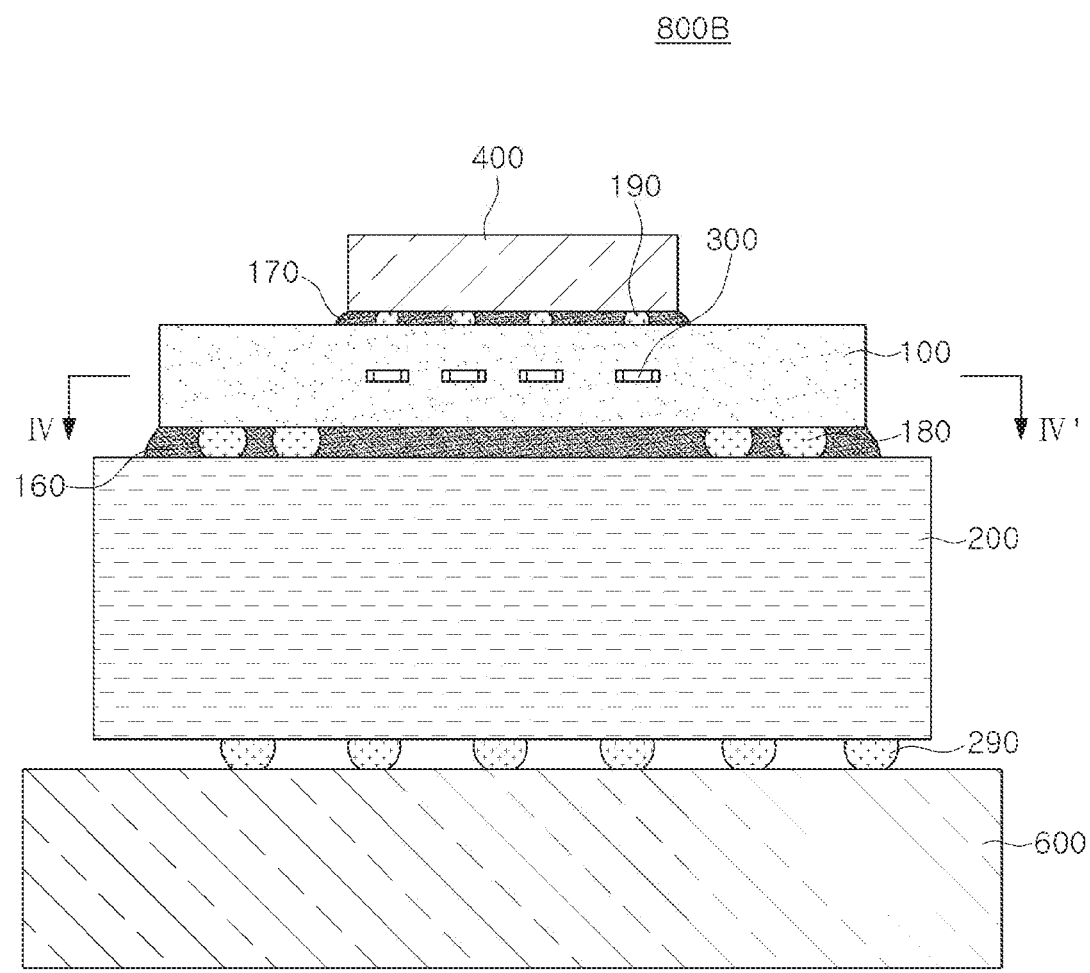
FIG. 14 is a schematic cross-sectional view illustrating another example of an electronic device including the substrate structure shown in FIG. 11.

FIG. 14 is a schematic cross-sectional view illustrating another example of an electronic device including the substrate structure shown in FIG. 11.

Referring to FIG. 14, an electronic device 800B according to another example includes a mainboard 600, a first printed circuit board 100 disposed on the mainboard 600, a second printed circuit board 200 disposed between the mainboard 600 and the first printed circuit board 200, a semiconductor chip 400 disposed on the first printed circuit board 100, and a plurality of passive components 300 embedded in the first printed circuit board 100. The first and second printed circuit boards 100 and 200 may be connected to each other through a plurality of first connection metals 180. The semiconductor chip 400 may be surface-mounted on the first printed circuit board 100 through a plurality of second connection metals 190. The second printed circuit board 200 may be connected to the mainboard 600 through a plurality of third connection metals 290. A first underfill resin 160 may be disposed between the first printed circuit board 100 and the second printed circuit board 200 to cover at least a portion of the plurality of first connection metals 180. An underfill resin 170 may be disposed between the first printed circuit board 100 and the semiconductor chip 400 to cover at least a portion of the plurality of second connection metals 190. Most of the other contents are substantially the same as described above, and thus, duplicate descriptions are omitted.

Figure 15:
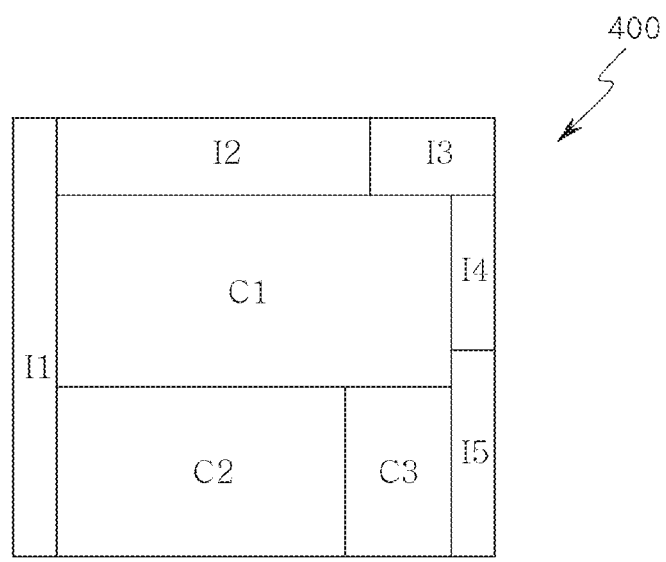
FIG. 15 is a schematic plan view illustrating a disposition of functional circuits inside of a semiconductor chip of the electronic device shown in FIG. 14.

FIG. 15 is a schematic plan view illustrating a disposition of functional circuits inside of a semiconductor chip of the electronic device in FIG. 14.

Referring to FIG. 15, a semiconductor chip 400 includes a plurality of functional circuit units C1, C2, C3, I1, I2, I3, I4, and I5. For example, the semiconductor chip 400 may include core functional circuit unit (s) C1, C2, and C3 and input/output functional circuit unit(s) I1, I2, I3, I4, and I5. However, the present disclosure is not limited thereto, and the semiconductor chip 400 may further include an interface unit, a memory unit, and the like. The core units C1, C2, and C3 may include at least one of a central processing unit (CPU), a graphics processing unit (GPU), a digital signal processor unit (DSPU), an image signal processing unit (ISPU), and a neural processing unit (NPU). The semiconductor chip 400 including such internal units may be, for example, an application processor chip, but is not limited thereto. Most of the other contents are substantially the same as described above, and thus, duplicate descriptions are omitted.

Figure 16:
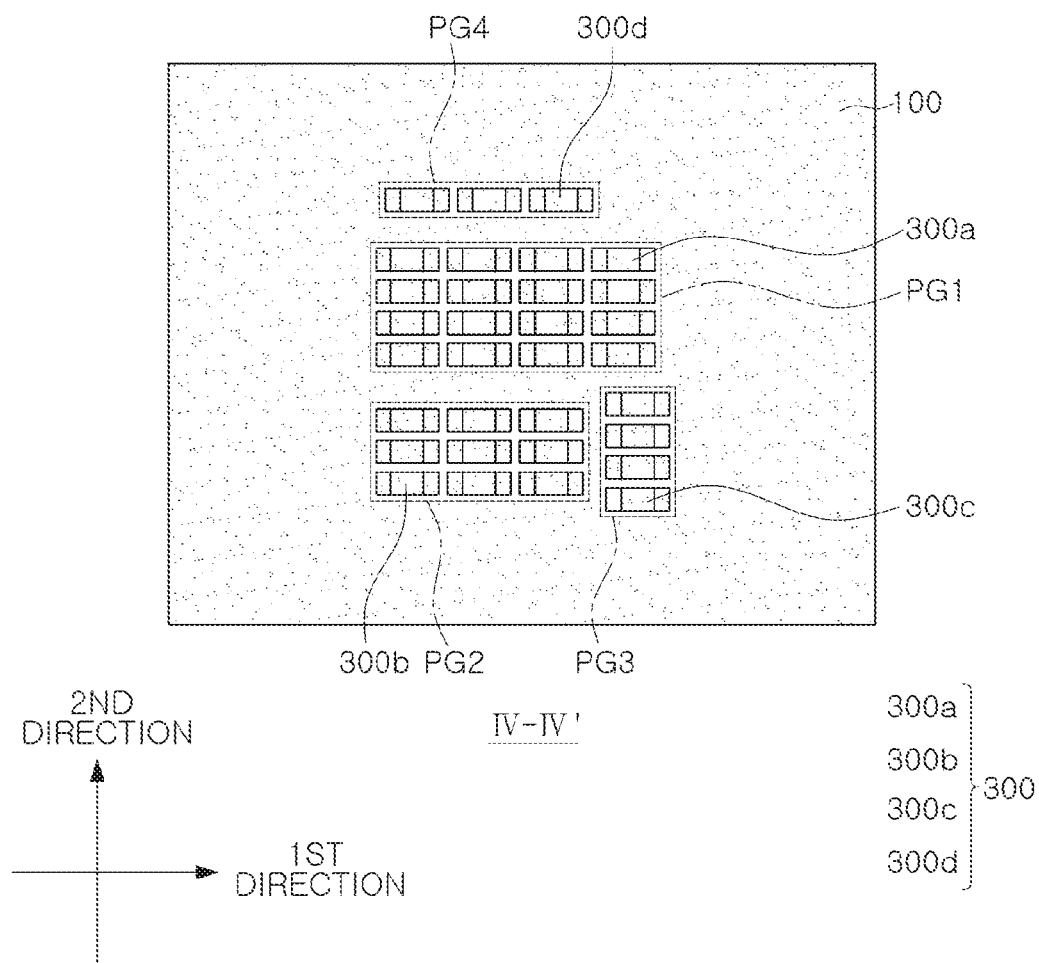
FIG. 16 is a schematic cutaway plan view, taken along line IV-IV' in FIG. 14, illustrating a first printed circuit board of the substrate structure of the electronic device shown in FIG. 14.

FIG. 16 is a schematic cutaway plan view, taken along line IV-IV' in FIG. 14, illustrating a first printed circuit board of the substrate structure of the electronic device depicted in FIG. 14.

Referring to FIG. 16, the plurality of passive components 300 includes a first group PG1 including a plurality of first passive components 300a disposed adjacent to each other, a second group PG2 including a plurality of second passive components 300b disposed adjacent to each other, a third group PG3 including a plurality of third passive components 300c disposed adjacent to each other, and a fourth group PG4 including a plurality of fourth passive components 300d disposed adjacent to each other. The number of first to fourth groups PG1 to PG4 may be adjusted as appropriate. For example, the plurality of passive components 300 may include fewer groups than that those illustrated in the drawings, or may include more groups than those illustrated in the drawings.

Figure 17:
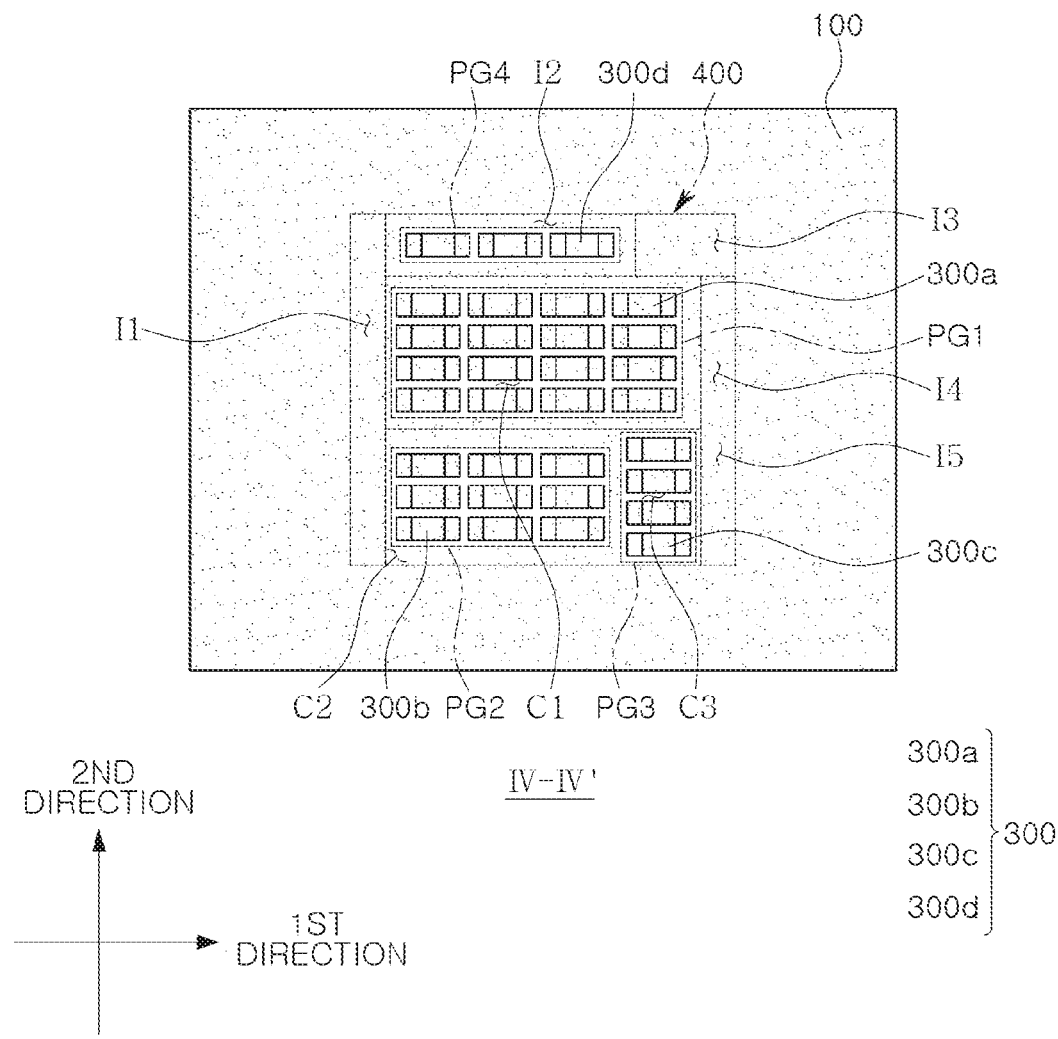
FIG. 17 is a schematic plan view provided such that the disposition of functional circuits inside of the semiconductor chip shown in FIG. 15 overlaps the schematic cutaway plan view of FIG. 16, taken along line IV-IV' in FIG. 14, illustrating the printed circuit board shown in FIG. 14.

FIG. 17 is a schematic plan view provided such that the disposition of the functional circuits inside of the semiconductor chip as shown in FIG. 15 overlaps the schematic cutaway plan view of FIG. 16, taken along line IV-IV' in FIG. 14, illustrating the printed circuit board in FIG. 14.

Referring to FIG. 17, at least a portion of a plurality of passive components 300a, 300b, 300c, and 300d grouped into groups PG1, PG2, PG3, and PG4 of a plurality of passive components 300 may be disposed to overlap at least one of the plurality of functional circuit units C1, C2, C3, I1, I2, I3, I4, and I5 of the semiconductor chip 400, when viewed from above. For example, the first group PG1 may be disposed directly below the first core unit C1. The second group PG2 may be disposed directly below the second core unit C2. The third group PG3 may be disposed directly below the third core unit C3. As described above, when a plurality of passive components 300a, 300b, and 300c grouped into the groups PG1, PG2, and PG3 are disposed directly below the core units C1, C2, and C3, a better power integrity improvement effect may be obtained. Additionally, the fourth group PG4 may be disposed directly below an input/output unit I2 having a relatively larger area than each of the other input/output units I1, I3, I4, and I5. Most of the other contents are substantially the same as described above, and thus, duplicate descriptions are omitted.

Figure 18:
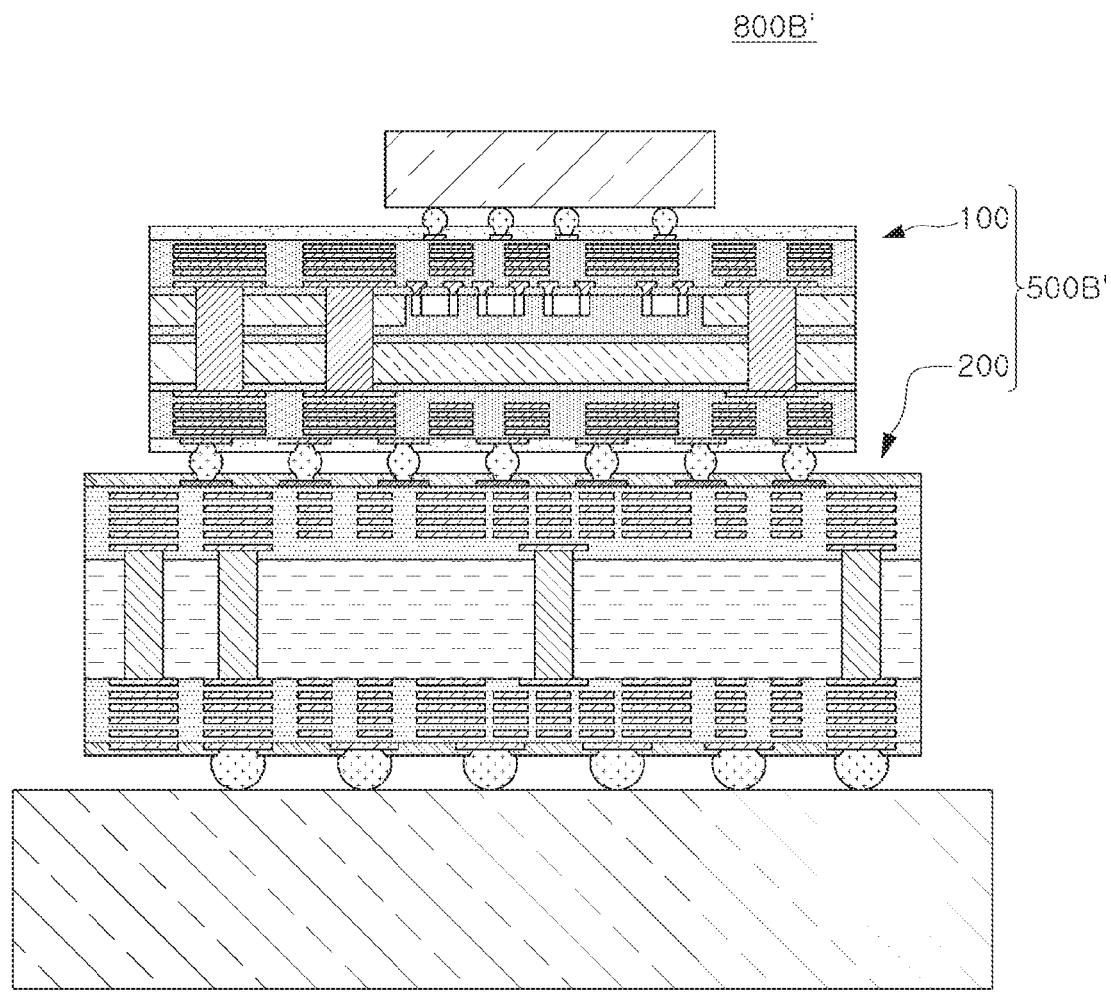
FIG. 18 is a schematic cross-sectional view illustrating a modified example of the electronic device in shown FIG. 14.

FIG. 18 is a schematic cross-sectional view illustrating a modified example of the electronic device in FIG. 14.

Referring to FIG. 18, an electronic device 800B' according to a modified example includes a substrate structure 500B' according to the modified example. For example, a first printed circuit board 100 may be a core-type printed circuit board. A second printed circuit board 200 may also be a core-type printed circuit board. Most of the other contents are substantially the same as described above, and thus, duplicate descriptions are omitted.

As described above, a substrate structure is provided that is capable of keeping up with a high-multilayer and large-scale substrate, and an electronic device including the same is also provided.

In addition, a substrate structure, capable of reducing costs, and an electronic device including the same, are provided.

In addition, a substrate structure, capable of improving power integrity, and an electronic device including the same, are provided.

In the present disclosure, the terms "lower side", "lower portion", "lower surface," and the like, have been used to indicate a direction toward a mounted surface of the electronic component package in relation to cross sections of the drawings, and the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, components that are "electrically connected" may be physical connected or physical disconnected. It can be understood that when an element is referred to as "first" and "second", the element is not limited thereby. These terms may be used only for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are generally amenable to being combined in whole or in part one with another. For example, a description of one element described in a particular example embodiment, even if it is not described in another example embodiment, may be understood as including a description related to the other example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A printed circuit board having opposing first and second surfaces, and configured for having a semiconductor chip, having first and second functional circuits disposed adjacent to each other on a plane, mounted on the second surface, the printed circuit board comprising:
    a planar insulating layer; and
    passivation layers disposed between the planar insulating layer and each of the first and second surfaces, and each having openings exposing pads through a corresponding one of the first or second surface,
    wherein the planar insulating layer includes a cavity having a plurality of passive components disposed therein and connected to the pads exposed through the second surface, and
    a first passive component of the plurality of passive components is disposed in an area overlapped by the first functional circuit of the semiconductor chip, and a second passive component of the plurality of passive components is spaced apart from the first passive component and is disposed in an area overlapped by the second functional circuit of the semiconductor chip.

2. The printed circuit board of claim 1, further comprising:
    a build-up layer disposed between the planar insulating layer and one of the first or second surface of the printed circuit board, and having wiring layers disposed therein and connected to the exposed pads,
    wherein at least one passivation layer of the passivation layers is disposed between the build-up layer and the one of the first or second surface.

3. The printed circuit board of claim 1, further comprising:
    connection metals, each having a lower melting point than copper (Cu), disposed on the pads in the openings of the passivation layers on the first and second surfaces of the printed circuit board.

4. The printed circuit board of claim 1, wherein the plurality of passive components disposed in the cavity includes:
    a plurality of first passive components disposed adjacent to each other at regular intervals, and disposed in the area overlapped by the first functional circuit of the semiconductor chip, and
    a plurality of second passive components disposed adjacent to each other at regular intervals, and disposed in the area overlapped by the second functional circuit of the semiconductor chip.

5. The printed circuit board of claim 1, wherein the plurality of passive components disposed in the cavity includes:
    a plurality of first passive components disposed adjacent to each other, and disposed in the area overlapped by the first functional circuit of the semiconductor chip, and a plurality of second passive components disposed adjacent to each other, and disposed in the area overlapped by the second functional circuit of the semiconductor chip, and wherein the first passive components are closer to each other than to any second passive component, and the second passive components are closer to each other than to any first passive component.

6. The printed circuit board of claim 1, comprising a plurality of insulating layers including the planar insulating layer, and at least one bonding layer disposed between the plurality of insulating layers, and the cavity penetrates through at least one of the plurality of insulating layers.

7. An electronic device comprising:

the printed circuit board of claim 1;

the semiconductor chip mounted to the second surface of the printed circuit board; and an interposer substrate mounted to the first surface of the printed circuit board, and including a plurality of wiring layers connected to the pads exposed through the first surface of the printed circuit board.

* * * * *